United States Patent
Van Bezooijen

[11] Patent Number: 6,009,126
[45] Date of Patent: Dec. 28, 1999

[54] ZERO-IF RECEIVER

[75] Inventor: Adrianus Van Bezooijen, Eindhoven, Netherlands

[73] Assignee: U.S. Philips Corporation, New York, N.Y.

[21] Appl. No.: 08/904,381

[22] Filed: Aug. 1, 1997

[30] Foreign Application Priority Data

Sep. 6, 1996 [EP] European Pat. Off. .............. 96202481

[51] Int. Cl.⁶ .......................... H04L 25/06; H04L 25/10; H04B 1/10

[52] U.S. Cl. .......................... 375/319; 375/316; 375/324; 375/325; 375/345; 375/349; 329/318; 329/319; 329/304; 329/306; 329/307; 455/303; 455/304; 455/306; 455/310

[58] Field of Search ...................... 375/319, 316, 375/324, 345, 349, 325; 329/318, 319, 306, 307, 304; 455/310, 303, 304, 306

[56] References Cited

U.S. PATENT DOCUMENTS

| | | | |
|---|---|---|---|
| 3,953,805 | 4/1976 | Couvillon | 327/307 |
| 4,736,390 | 4/1988 | Ward et al. | 375/316 |
| 4,944,025 | 7/1990 | Gehring et al. | 455/207 |
| 5,422,889 | 6/1995 | Sevenhans et al. | 370/442 |
| 5,438,692 | 8/1995 | Mohindra | 455/324 |
| 5,584,068 | 12/1996 | Mohindra | 455/324 |
| 5,724,653 | 3/1998 | Baker et al. | 455/207 |
| 5,896,562 | 4/1999 | Heinonen | 455/76 |
| 5,918,167 | 6/1999 | Tiller et al. | 455/310 |
| 5,953,643 | 9/1999 | Speake et al. | 455/324 |

FOREIGN PATENT DOCUMENTS

0594894A1  5/1994  European Pat. Off. ........ H04L 27/22

OTHER PUBLICATIONS

"Active and Passive Analog Filter Design", Section 5.2, L.P. Huelsman, Mc Graw–Hill, Inc. 1993.

"The Art of Electronics", P. Horowitz et al, Cambridge University Press, pp. 416 and 420–423.

Primary Examiner—Stephen Chin
Assistant Examiner—Michael W. Maddox

[57] ABSTRACT

Known is a zero intermediate frequency receiver or zero-IF receiver in which DC-offset correction is done in the I- and Q-paths, after mixing down of the received RF-signal or of an IF-signal. Such a DC-offset correction is not sufficient for high gain I- and Q-paths, particularly not in pagers for receiving long messages. Furthermore, no optimal power saving is achieved if such a receiver alternately operates in receive mode and sleep mode. A zero intermediate frequency receiver is proposed in which DC-offset correction is distributed over the high gain I- and Q-path. Preferably, blocking means are provided between DC-offset correction circuits and low pass filters in the I- and Q-path to prevent that an output signal of an upstream DC-offset correction circuit in the path excites a downstream low pass filter in the path during DC-offset correction. Herewith, considerable power savings are achieved.

14 Claims, 3 Drawing Sheets

ZERO-IF RECEIVER

BACKGROUND OF THE INVENTION

The present invention relates to a zero intermediate frequency receiver comprising a local frequency generating arrangement which is coupled to a pair of quadrature related mixers for mixing down a received signal to a pair of quadrature related signals to be demodulated in an in-phase signal path and in a quadrature signal path, a path comprising a cascade of at least a low pass filter and two amplifiers, and a DC-offset correction circuit between the amplifiers. Such a zero intermediate frequency receiver, which can be a direct conversion zero-IF receiver, a double conversion zero-IF receiver, or any other suitable zero-IF receiver, can be a digital paging receiver using a FSK (Frequency Shift Keying) or PSK (Phase Shift Keying) modulation scheme, but also a cordless or cellular receiver, or the like.

A receiver of the above kind is known from the published European Patent Application EP 0 594 894 A1. This European Patent Application discloses DC-offset correction in a zero intermediate frequency TDMA receiver or so-called zero-IF receiver. The received signal is mixed down by mixing with a local oscillator in a quadrature mixer. A DC-offset in the mixed down signal is compensated by baseband processing. For DC-offset correction a control loop is provided in both the in-phase signal path and the quadrature signal path. In addition to an overall correction loop in which DC-offset is corrected over many time slots, the receiver comprises an inner control loop for offset correction of a signal received within a time slot. This additional control loop may include a comparator comparing a difference signal in the overall control loop with zero and thereby acting as a one-bit analog-to-digital converter, cascaded with a successive approximation digital-to-analog converter determining in successive steps an offset correction value of the overall control loop so that the value of the difference signal is substantially zero. A zero intermediate frequency receiver can be a part of a message pager. Such pagers are narrow band receivers having a high gain in the in-phase and quadrature signal paths. With new paging protocols like APOC, FLEX and ERMES very long messages can be sent. During the reception of the signal the DC-drift has to be sufficiently small (typically<3 $\mu$V at the output of the mixer). Otherwise, zero crossings in the in-phase or I-signal and in the quadrature or Q-signal will be lost. Furthermore, when receiving relatively long messages, DC-offset correction can only be done during the reception of a sync-word (approximately once every second), without losing useful information, i.e. a part of a message to be received. For such receivers, the known DC-offset correction does not operate satisfactorily. Furthermore, pagers normally operate in a reception mode for receiving messages and in a sleep mode during which most of the reception circuitry is switched off. For saving the battery of the pager, the period in which the pager is in the reception mode should be as short as possible.

OBJECTS AND SUMMARY OF THE INVENTION

It is an object of the present invention to provide an accurate DC-offset correction in a high gain zero-IF signal path of a zero-IF receiver. It is a further object of the present invention to provide a zero intermediate frequency receiver having an optimal sleep-mode/reception-mode ratio.

To this end the zero intermediate frequency receiver according to the present is characterized in that the path comprises at least a second DC-offset correction circuit which is distributed over the path for allowing the path to have a high gain. Preferably, the paths are made DC-offset free in a sequential way, whereby the second DC-offset correction circuit can be activated after a given settling time of the receiver circuitry, and, after a predetermined settling time of the low pass filter, the first DC-correction circuitry can be activated.

In an embodiment of a zero intermediate frequency receiver according to the present invention, a second low pass filter of the at least one low pass filter is coupled to an output of the first DC-offset correction circuit, whereby the first low pass filter has a lower selectivity than the second low pass filter. Herewith, different dynamic requirements in the path are fulfilled. At different locations in the path the signal levels are different and herewith the linearity requirements. Initially, the selectivity is low and the filter should exhibit a good linearity. The first filter can thus be a simple active RC-filter such as a so-called Sallen and Key filter as described in the handbook "Active and Passive Analog Filter Design", Section 5.2, L. P. Huelsman, McGraw-Hill, Inc., 1993. More downstream the path, after amplification, the signal levels are higher and therefore, filters with a higher selectivity can be used such as gyrator filter, well-known in the art.

In an embodiment of a zero intermediate frequency receiver according to the present invention, the path comprises blocking means to prevent that an output signal of an upstream DC-offset correction circuit in the path excites a downstream low pass filter in the path during DC-offset correction. Without the blocking means, filters downstream in the path would exhibit ringing due to excitation caused by a DC-offset correction circuit upstream in the path. It would take a relatively long period of time before the amplitude of the ringing signal would be sufficiently small to start a DC-offset correction circuit downstream in the path. The blocking means achieves that the low pass filter is not excited by an upstream DC-offset correction circuit. Herewith, the receiver-on time is considerably shorter so that battery power is saved. The blocking means can be a first clamp circuit which is coupled to an input of the first low pass filter.

In an embodiment of a zero intermediate frequency receiver according to the present invention, the path comprises a first buffer amplifier for isolating the second DC-offset correction circuit from the first clamp circuit. Herewith, the first clamp circuit is effectively isolated from the second DC-offset correction circuit so that a better performance is achieved.

In the embodiments in which due to dynamic range requirements the filter function and the amplification function are distributed over the path, the clamp functionality is also distributed over the path. The bias circuits of relevant circuitry such as at least the amplifiers and the DC-offset correction circuits are switched off if the receiver enters its power down mode. The DC-offset correction circuits can be droop-less sample-and-hold circuits such as a successive approximation analog-to-digital converter. For filtering noise at an output of a digital-to-analog converter being a part of the successive approximation filter, a low pass filter can be provided between the output of the digital-to-analog converter and a subtraction input of a subtracter in the DC-offset correction circuit, the subtracter being situated in the path and subtracting a determined DC-offset correction signal from the path signal to be corrected.

BRIEF DESCRIPTION OF THE DRAWINGS

The present invention will now be described, by way of example, with reference to the accompanying drawings, wherein FIG. 1 schematically shows a zero intermediate frequency receiver according to the present invention.

Throughout the figures the same reference numerals are used for the same features.

DETAILED DESCRIPTION OF THE PREFERRED EMBODIMENT

Figure 1:
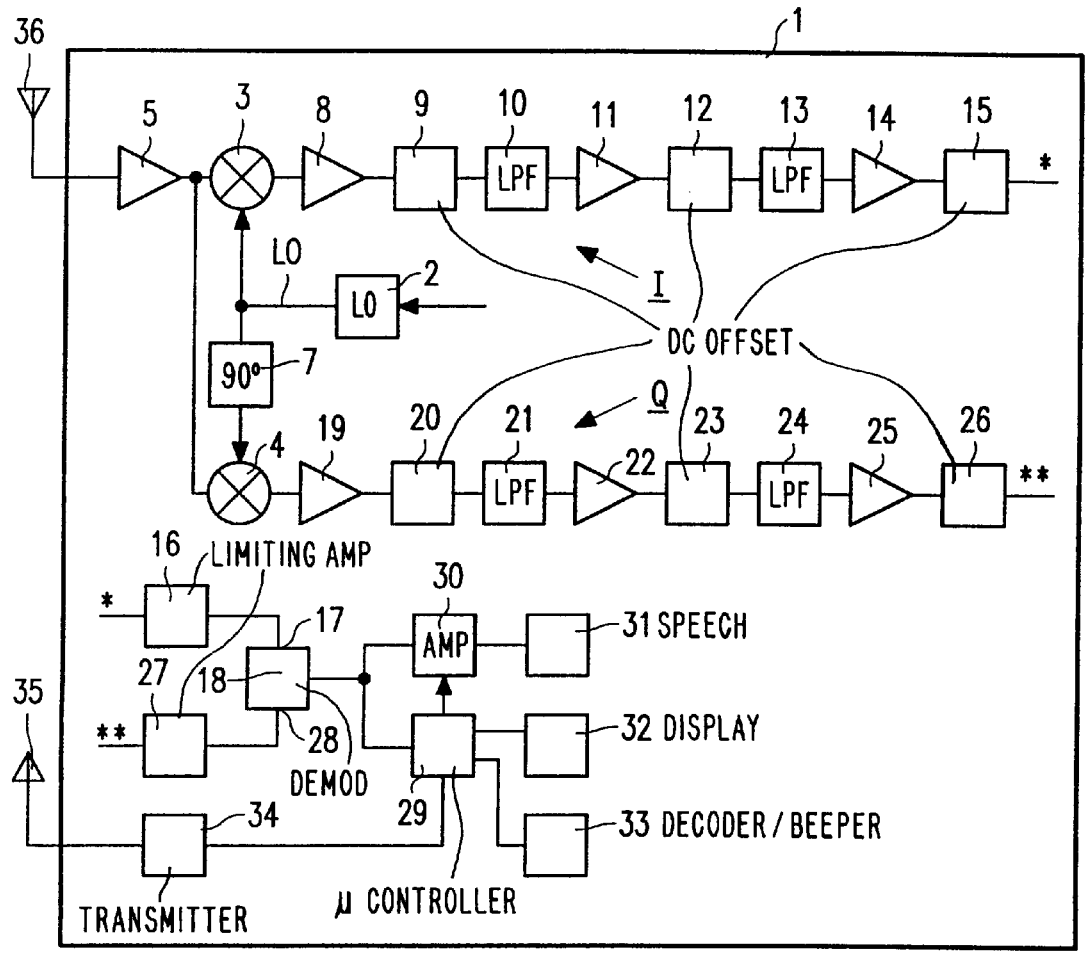

FIG. 1 schematically shows a zero intermediate frequency receiver 1 according to the present invention comprising a local frequency generating arrangement 2 which is coupled to a pair of quadrature related mixers 3 and 4 for mixing down a received signal rf that is fed to the mixers 3 and 4 via a low noise amplifier 5. A local oscillator signal LO generated by the local frequency generating arrangement 2 is fed to an input of the mixer 3 which is comprised in an in-phase signal path I and further to the mixer 4 via a 90° phase shifting arrangement 7. The zero-IF receiver 1 can also be a double conversion receiver having a further IF-stage (not shown in detail) before the mixers 3 and 4 for first converting the received signal rf to a relatively high intermediate frequency. After mixing down of the rf signal or the relatively high intermediate frequency, the signals are so-called zero-IF (Intermediate Frequency) signals. If the receiver 1 is a double conversion receiver, a divide-by-two arrangement (not shown in detail) is used for forming the quadrature oscillator signals from the local oscillator signal. The path I comprises a cascade of a post mixer amplifier 8, a second DC-offset correction circuit 9, a first low pass filter 10, a first amplifier 11, a first DC-offset correction circuit 12, a second low pass filter 13, a second amplifier 14, a third DC-offset correction circuit 15, and a limiting amplifier 16 of which an output is coupled to a first input 17 of a demodulator 18 which can be an FSK-modulator (Frequency Shift Keying) for demodulating FSK-signals. Such demodulators are well-known in the art. Similarly, the path Q comprises a cascade of a post mixer amplifier 19, a DC-offset correction circuit 20, a low pass filter 21, an amplifier 22, a DC-offset correction circuit 23, a low pass filter 24, an amplifier 25, a DC-offset correction circuit 26, and a limiting amplifier 27 of which an output is coupled to a second input 28 of the demodulator 18. In the drawing one * indicates continuation of the path I and two ** indicate continuation of the path Q. The zero intermediate frequency receiver 1 further comprises a programmed microcontroller 29 for carrying out control functions. Such a microcontroller contains RAM and ROM memory and analog and digital interface circuits and is readily available onto the market. The zero intermediate frequency receiver can be a pager, a cordless or cellular telephone, or the like, or can be incorporated into other devices like a PC, a Television Set, an InterNet interface, or the like. In the example given, the zero intermediate frequency receiver is a pager, such a pager further comprising an amplifier 30 coupled to the demodulator 18 and to a speech reproduction device 31 for outputting paging messages in a spoken format. Such paging messages can also be displayed on an display 32 and/or can be made audible by means of a decoder/beeper 33 for decoding a particular message and for making the message audible as a predetermined tone sequence. In case of a so-called two-way pager, the pager also comprises transmitter means 34 coupled to a transmission antenna 35. At reception side, the zero intermediate frequency receiver is coupled to a reception antenna 36. In the sequel, only DC-offset correction for the path I will be described, DC-offset correction for the path Q being similar. Because of the fact that the DC-offsets in the path I and in the path Q are independent, the DC-offset corrections in the path I and Q can be done simultaneously. Herewith, the turn-on time of the receiver 1 can be reduced so that more power savings are obtained.

Figure 2:
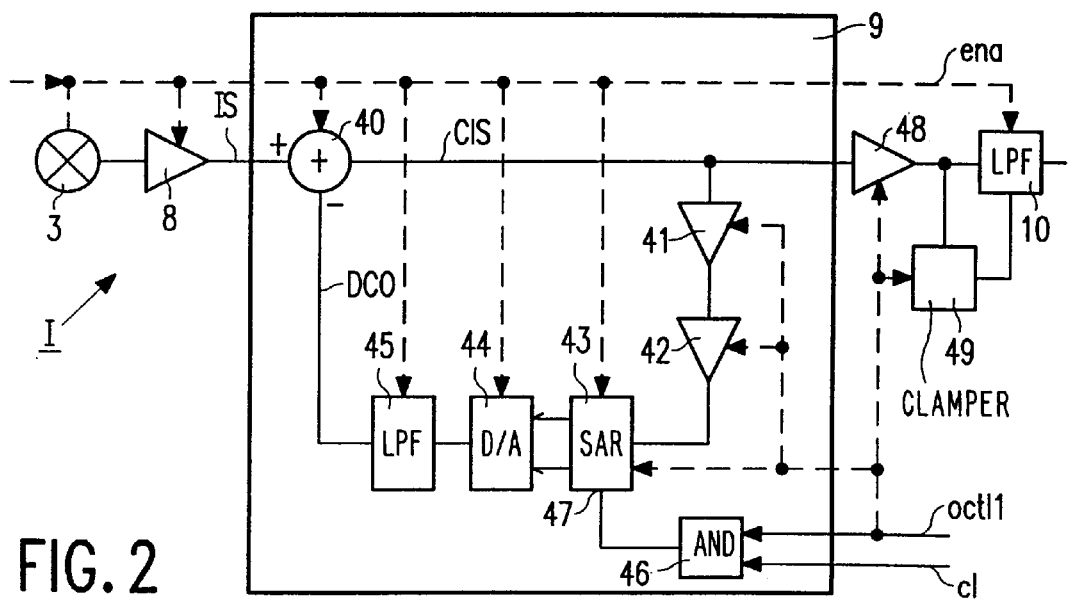
FIG. 2 shows a DC-offset correction circuit according to the present invention.

FIG. 2 shows the second DC-offset correction circuit 9 according to the present invention. The other DC-offset correction circuits 12, 15, 20, 23 and 26 have a similar construction and operation. The second DC-offset correction circuit 9 comprises a subtracter 40 for subtracting a determined DC-correction signal DCO from an uncorrected signal IS in the path I so as to provide a DC-offset corrected signal CIS. The second DC-offset correction circuit 9 further comprises a correction loop comprising an analog-to-digital converter of the so-called successive approximation type. Such an analog-to-digital converter comprises a cascade of a sensing amplifier 41, a limiting amplifier 42, a successive approximation register or SAR 43, and a digital-to-analog converter 44. For noise filtering of an output signal of the digital-to-analog converter 44 a low pass filter 45 is provided. The operation of an analog-to-digital converter of the successive approximation type is well-known per se. A more detailed description can be found in the handbook "The Art of Electronics", p. 416 and pp. 420–423, Horowitz and Hill, Cambridge United Press 1980. Such an analog-to-digital converter operates like a droop-less sample-and-hold circuit. Furthermore, with such an analog-to-digital converter type, DC-offset correction can be achieved within a relatively low number of clock cycles and the complexity is relatively low, which is an advantage. The DC-offset correction advantageously is carried out in a number of coarse conversion and a number of fine conversion cycles. The DC-offset correction circuit 9 further comprises an AND-gate 46 of which an output is coupled to a control line 47 of the successive approximation register 43 and to respective inputs of which a clock signal cl and a DC-offset control signal octl1 are fed, these signals being provided by the programmed microcontroller 29. Furthermore, an enable control signal ena is shown for switching on or off various circuitry, if the receiver 1 is in receive mode or in sleep mode, respectively. The control signal octl1 activates the DC-biasing of the SAR 43, of the amplifiers 41 and 42, and of a buffer amplifier 48 and a clamp circuit 49, the buffer amplifier 48 being provided for isolating the DC-offset correction circuit from the low pass filter 10 so as to prevent excitation thereof during DC-offset correction, and the clamp circuit 49 being provided to supply a defined reference voltage to the low pass filter 10 during DC-offset correction. During DC-offset correction, the clock signal cl operates the SAR 43. The minimum number of clock cycles required is equal to the number of bits of the digital-to-analog converter 44. At completion of the DC-offset correction, the SAR 43 contains a digital version of the signal DCO to be subtracted of the path signal IS. Then, the amplifiers 41 and 42 go into power-down mode, the clamp circuit 49 is released, and the buffer amplifier 48 is activated. More in detail operation is as follows, whereby for simplicity it is assumed that the ADC is a 3-bit successive approximation ADC. The DC-offset correction starts with a preset pulse setting the MSB (Most Significant Bit) to a high bit value in the first clock cycle. In a second clock cycle a first MSB bit will be set high and will remain high or will be given a low bit value depending on the sign of the output signal of the subtracter 40. In a third clock cycle a second MSB will be set high and the first MSB will remain high or will be given a low bit value depending on the sign of the output signal of the subtracter 40. The DC-offset correction process is finished after the setting of the LSB (Least Significant Bit). In a practical circuit the number of bits is greater than the 3 bits given in the simplified example. Typically, a 9 bit ADC/DAC combination will give satisfactory results. The filter 45 can be made adaptive such that during acquisition of the DC-offset the bandwidth is substantially higher than otherwise. Herewith, sufficiently low settling errors are achieved. If the low pass filter 13 is also present in the path I, a similar clamp circuit and buffer amplifier (not shown in detail) are coupled to the input of the low pass filter and in the path I, respectively.

Figure 3:
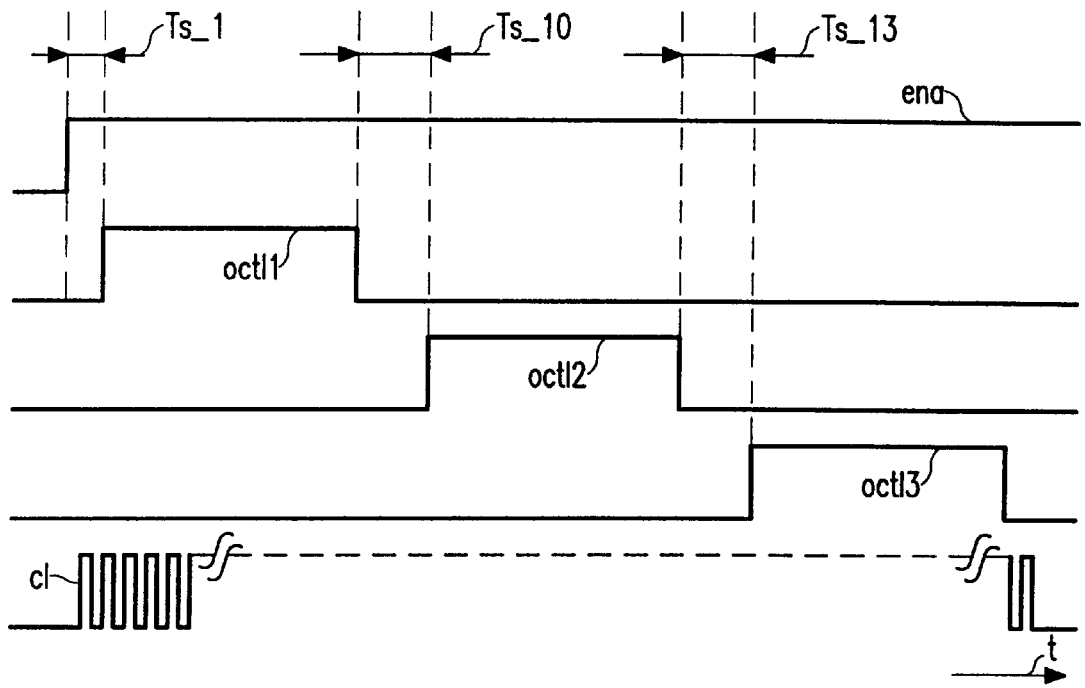
FIG. 3 shows a timing diagram for illustrating DC-offset correction according to the present invention.

FIG. 3 shows a timing diagram for illustrating DC-offset correction according to the present invention as a function of time t. Shown are the control signals ena, octl1 for enabling the receiver 1 and for activating DC-offset determination in the DC-correction circuit 9. In the downstream direction of the path I, respective DC-offset correction is done by sequentially activating the second DC-offset circuit 9, the first DC-offset correcting circuit 12 and the third DC-offset correction circuit 15. To this end further DC-offset control signals octl2 and octl3 activate the first and the third DC-offset correction circuits, respectively. After switching on of the receiver 1 the first DC-offset correction in the path I is done after a predetermined settling time Ts_1 of the receiver 1. After the first DC-offset correction, the second DC-offset correction is done after a predetermined settling time Ts_10 of the first low pass filter 10, and after the second DC-offset correction the third DC-offset correction is done after a predetermined settling time Ts_13 of the low pass filter 13.

Figure 4:
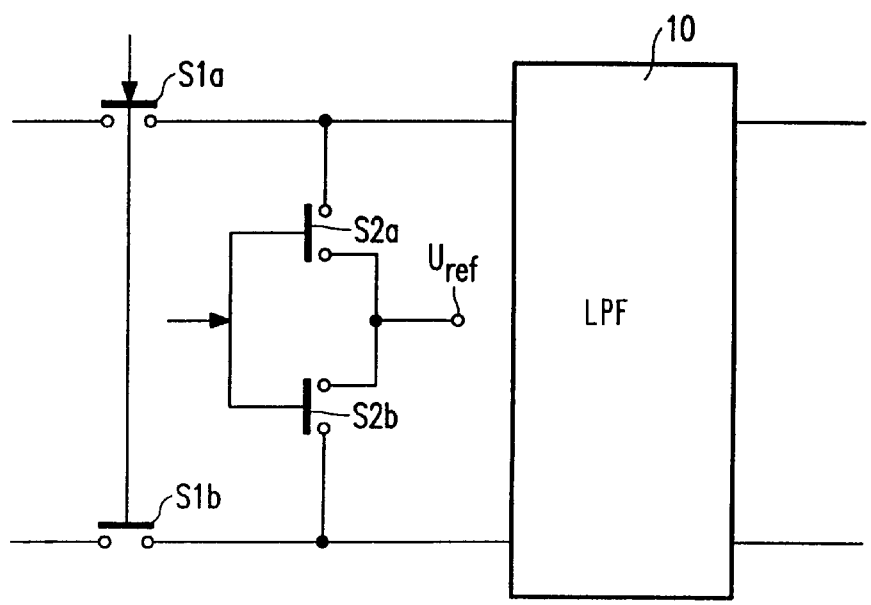
FIG. 4 shows blocking means to prevent that an output signal of an upstream DC-offset correction circuit in the path excites a downstream low pass filter in the path during DC-offset correction.

FIG. 4 shows blocking means to prevent that an output signal of an upstream DC-offset correction circuit in the path excites a downstream low pass filter in the path during DC-offset correction. The blocking means principally are switches that can be implemented by means of electronic circuitry. Shown is an embodiment for both differential mode and common mode signals. The switches can be MOS transfer gates. In the principle diagram, a switch formed by contacts S1a and S1b constitutes the buffer means 48 for isolating the filter 10 from the DC-offset correction circuit 9 during DC-offset correction, and a switch formed by contacts S2a and S2b constitutes the clamp circuit 49. During clamping a reference voltage $U_{ref}$, which is equal to a common mode input voltage, is applied to the filter 10.

Figure 5:
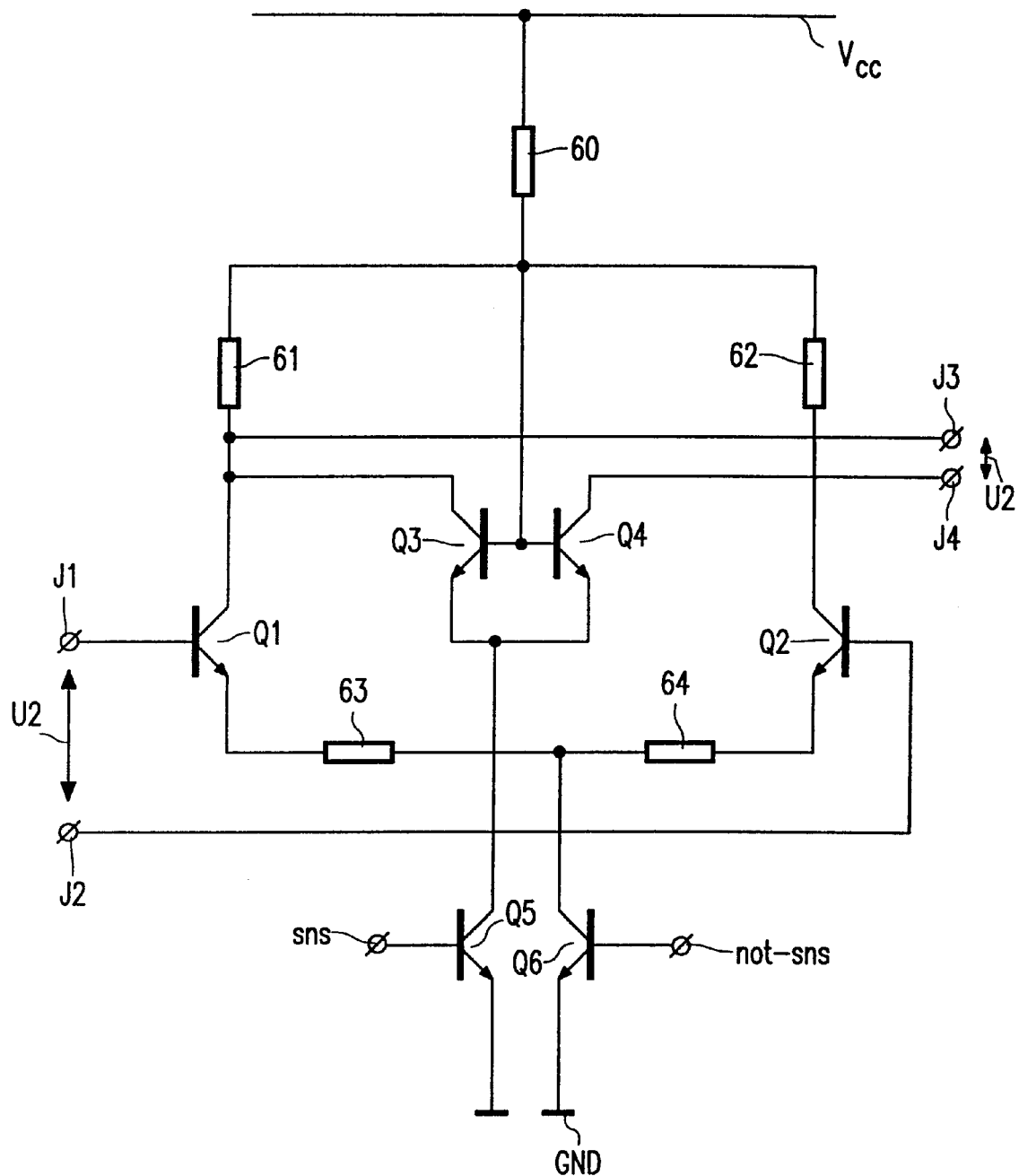
FIG. 5 shows an embodiment of the blocking means.

FIG. 5 shows an embodiment of the blocking means comprised of the buffer amplifier 48 and the clamp circuit 49. The buffer amplifier 48 consists of a degenerated differential pair formed by transistors Q1 and Q2. The clamp circuit 49 is formed by transistors Q3 and Q4. A buffer input signal U1 is applied to terminals J1 and J2, and a buffer output signal U2 becomes available between terminals J3 and J4. During DC-offset correction a current source formed by a transistor Q5 is activated and after termination of the DC-offset correction a transistor Q6 is activated. To this end complementary control signals sns and not-sns are applied to the transistors Q5 and Q6. Further shown in FIG. 5 are a supply rail $V_{cc}$ and a ground rail GND and resistors 60, 61, 62, 63 and 64, of which, in view of the foregoing description, the functions and meanings will be clear to the person skilled in the art.

While the principles of the invention have been described above in connection with a specific receiver, it is to be clearly understood that this description is made only by way of example and not as a limitation on the scope of the invention. Likewise, although the invention has been shown and described with respect to a best mode embodiment thereof, it should be understood by those skilled in the art that the foregoing and various other changes, omissions and additions in the form and detailed thereof may be made therein without departing from the spirit and the scope of the invention.

I claim:

1. A zero intermediate frequency receiver comprising a local frequency generating arrangement which is coupled to a pair of quadrature related mixers for mixing down a received signal to a pair of quadrature related signals to be demodulated in an in-phase signal path and in a quadrature signal path, a path comprising a cascade of at least one low pass filter and at least two amplifiers, and a first DC-offset correction circuit between the amplifiers, characterized in that the path comprises at least a second DC-offset correction circuit which is distributed over the path for allowing the path to have a high gain.

2. A zero intermediate frequency receiver according to claim 1, wherein the receiver is arranged to activate the DC-offset correction circuits sequentially.

3. A zero intermediate frequency receiver according to claim 1, wherein the second DC-offset correction circuit is coupled in the cascade before a first low pass filter of the at least one low pass filter.

4. A zero intermediate frequency receiver according to claim 3, wherein a second low pass filter of the at least one low pass filter is coupled to an output of the first DC-offset correction circuit, whereby the first low pass filter has a lower selectivity than the second low pass filter.

5. A zero intermediate frequency receiver according to claim 3, wherein the path comprises blocking means to prevent that an output signal of a upstream DC-offset correction circuit in the path excites an downstream low pass filter in the path during DC-offset correction.

6. A zero intermediate frequency receiver according to claim 5, wherein the blocking means comprises at least a first clamp circuit which is coupled to an input of the first low pass filter.

7. A zero intermediate frequency receiver according to claim 6, wherein the path comprises a first buffer amplifier for isolating the second DC-offset correction circuit from the first clamp circuit.

8. A zero intermediate frequency receiver according to claim 5, wherein the blocking means comprises a second clamp circuit which is coupled to an input of the second low pass filter.

9. A zero intermediate frequency receiver according to claim 8, wherein the path comprises a second buffer amplifier for isolating the first DC-offset correction circuit from the second clamp circuit.

10. A zero intermediate frequency receiver according to claim 1, wherein the receiver is arranged for operating in a power saving mode, whereby at least bias currents of at least the amplifiers, filters and DC-offset correction circuits are switched off if the receiver is in the power saving mode.

11. A zero intermediate frequency receiver according to claim 1, wherein the DC-offset correction circuits are droop-less sample-and-hold circuits.

12. A zero intermediate frequency receiver according to claim 11 wherein the droop-less sample-and-hold circuits are formed by a subtracter comprised in the path and a cascade of an analog-to-digital converter, a latch circuit, and a digital-to-analog converter coupled in a loop with the subtracter, an output of the digital-to-analog converter being coupled to a subtraction input of the subtracter.

13. A zero intermediate frequency receiver according to claim 12, wherein a low pass filter is provided between the output of the digital-to-analog converter and the subtraction input of the subtracter.

14. A zero intermediate frequency receiver according to claim 12, wherein the cascade is an analog-to-digital converter of the successive approximation type.

* * * * *